US010377904B2

(12) United States Patent
Inoue et al.

(10) Patent No.: US 10,377,904 B2
(45) Date of Patent: Aug. 13, 2019

(54) INORGANIC HYDROPHILIC COATING SOLUTION, HYDROPHILIC COATING FILM OBTAINED THEREFROM, AND MEMBER USING SAME

(75) Inventors: Tomohiro Inoue, Kamisu (JP); Manabu Furudate, Kamisu (JP); Yoshitsugu Eguchi, Narita (JP); Tadashi Amano, Kamisu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 589 days.

(21) Appl. No.: 14/116,665

(22) PCT Filed: May 31, 2012

(86) PCT No.: PCT/JP2012/064096
§ 371 (c)(1),
(2), (4) Date: Nov. 8, 2013

(87) PCT Pub. No.: WO2013/001975
PCT Pub. Date: Jan. 3, 2013

(65) Prior Publication Data
US 2014/0127514 A1   May 8, 2014

(30) Foreign Application Priority Data

Jun. 29, 2011 (JP) ................................. 2011-144076

(51) Int. Cl.
| C09D 1/00 | (2006.01) |
| B01J 37/02 | (2006.01) |
| B01J 21/08 | (2006.01) |
| B01J 35/00 | (2006.01) |
| C09D 5/16 | (2006.01) |
| H01L 31/048 | (2014.01) |
| C09D 183/02 | (2006.01) |
| H02S 40/10 | (2014.01) |
| C09D 7/61 | (2018.01) |
| C09D 7/40 | (2018.01) |
| B01J 21/06 | (2006.01) |
| B01J 37/03 | (2006.01) |

(52) U.S. Cl.
CPC ............... C09D 1/00 (2013.01); B01J 21/08 (2013.01); B01J 35/004 (2013.01); B01J 37/0219 (2013.01); C09D 5/1662 (2013.01); C09D 7/61 (2018.01); C09D 7/67 (2018.01); C09D 183/02 (2013.01); H01L 31/048 (2013.01); H02S 40/10 (2014.12); B01J 21/063 (2013.01); B01J 35/002 (2013.01); B01J 37/033 (2013.01); Y02E 10/50 (2013.01); Y10T 428/31507 (2015.04); Y10T 428/31667 (2015.04)

(58) Field of Classification Search
CPC ........ B01J 21/063; B01J 21/08; B01J 35/002; B01J 35/004; B01J 37/0219; B01J 37/033; C09D 183/02; C09D 1/00; C09D 5/1662; C09D 7/1216; C09D 7/1266; H01L 31/048; H02S 40/10; Y02E 10/52; Y10T 428/31507; Y10T 428/31667
See application file for complete search history.

(56) References Cited

U.S. PATENT DOCUMENTS

| 4,324,712 | A | * | 4/1982 | Vaughn, Jr. .......... | C09D 183/04 |
| | | | | | 106/287.11 |
| 6,228,480 | B1 | * | 5/2001 | Kimura ................. | B01J 35/002 |
| | | | | | 106/287.13 |
| 2001/0008696 | A1 | | 7/2001 | Takahama et al. | |
| 2006/0222847 | A1 | | 10/2006 | Tanaka et al. | |
| 2008/0248328 | A1 | * | 10/2008 | Hamada ................ | C01B 33/141 |
| | | | | | 428/688 |
| 2009/0246536 | A1 | | 10/2009 | Mitina et al. | |
| 2009/0305878 | A1 | | 12/2009 | Sakatani et al. | |
| 2010/0019211 | A1 | * | 1/2010 | Yi ............................ | B22F 1/02 |
| | | | | | 252/519.4 |

FOREIGN PATENT DOCUMENTS

| CN | 1263547 A | 8/2000 |
| CN | 101153126 A | 4/2008 |

(Continued)

OTHER PUBLICATIONS

Machine translation of JP 07-277724, retrieved Feb. 22, 2016.*
Combined Office Action and Search Report dated May 27, 2015 Chinese Patent Application No. 201280031819.3 (with partial English language translation and English Translation of Category of Cited Documents).
Japanese Office Action dated Aug. 12, 2014 in Patent Application No. 2013-522548 with English Translation.
International Search Report dated Aug. 7, 2012 in PCT/JP12/064096 Filed May 31, 2012.

*Primary Examiner* — Michael B Nelson
(74) *Attorney, Agent, or Firm* — Oblon, McClelland, Maier & Neustadt, L.L.P.

(57) ABSTRACT

An inorganic hydrophilic coating solution including (a) an aqueous solution containing an amorphous silicate compound obtained by hydrolyzing and condensing a tetrafunctional silicon compound having a purity of 99.0 mass % or greater in an aqueous medium in the presence of a basic compound at a temperature within a range from normal temperature to 170° C., (b) water, and optionally, (c) not more than 30 mass % of an alcohol, a ketone, or a surfactant, where the concentration of the solid fraction derived from the aqueous solution containing the amorphous silicate compound is 0.01 to 2.0 mass % and the pH is 5 to 8; an inorganic hydrophilic coating film formed from a dried and cured product of the inorganic hydrophilic coating solution; a member having a substrate and the inorganic hydrophilic coating film formed on the surface of the substrate; and a cover panel for a solar cell module including the member.

12 Claims, No Drawings

(56) References Cited

FOREIGN PATENT DOCUMENTS

| | | |
|---|---|---|
| CN | 101970370 A | 2/2011 |
| JP | 7 277724 | 10/1995 |
| JP | 9 249673 | 9/1997 |
| JP | 11 189408 | 7/1999 |
| JP | 2000 212510 | 8/2000 |
| JP | 2006 116461 | 5/2006 |
| JP | 2006 131917 | 5/2006 |
| JP | 2006-131917 A | 5/2006 |
| JP | 2006 272757 | 10/2006 |
| JP | 2010 270094 | 2/2010 |
| JP | 2011 111558 | 6/2011 |

* cited by examiner

INORGANIC HYDROPHILIC COATING SOLUTION, HYDROPHILIC COATING FILM OBTAINED THEREFROM, AND MEMBER USING SAME

CROSS REFERENCE TO RELATED APPLICATIONS

The present application is a 35 U.S.C. § 371 national stage patent application of International patent application PCT/JP2012/064096, filed on May 31, 2012, published as WO/2013/001975 on Jan. 3, 2013, the text of which is incorporated by reference, and claims the benefit of the filing date of Japanese application no. 2011-144076, filed on Jun. 29, 2011, the text of which is also incorporated by reference.

TECHNICAL FIELD

The present invention relates to a hydrophilic coating solution for protecting the surfaces of various substrates from staining. The hydrophilic coating solution of the present invention is an inorganic hydrophilic coating solution, yet can form a film that can suppress light reflection and coherence, and has a substrate stain resistance function derived from the extremely high hydrophilicity. Moreover, the coating solution is stable in aqueous systems and neutral environments, and can form a coating film even by curing at normal temperature. Accordingly, handling of the solution is safe and easy, during both industrial inline production and onsite operations, meaning a strong and transparent hydrophilic coating can be formed easily in any location.

BACKGROUND ART

A variety of stain-resistant coating agents have long been available commercially, primarily for residential construction materials such as glass and exterior walls.

Previously, techniques in which water repellency was used to repel the actual contaminants were widely employed. However, in recent years, it has become increasingly obvious that as a result of long-term exposure of these types of water-repellent films, a problem has arisen in that the water repellency of the material has become a source of electrostatic charging, which actually promotes the adsorption of dust and the adhesion of soiling.

In light of these circumstances, a variety of hydrophilic coating solutions have begun to be tested, with the expectation of preventing electrostatic charging and enabling soiling to be washed away by rainfall, and various methods of hydrophilizing members are being investigated, mainly focused on photocatalytic materials. In particular, photocatalysts are not only hydrophilic upon irradiation with light, but can also be expected to exhibit an oxidative decomposition action on soiling, and there are many practical examples of such photocatalysts.

For example, applications to organic materials including plastic materials and applications to decorative materials have been actively investigated in recent years, mainly in relation to applications to exterior tiles, glass, exterior wall coatings, internal filters of air cleaners, and inorganic substrates (such as ceramics and metals) (see Patent Document 1 and Patent Document 2).

However, currently, all of the hydrophilic coating solutions that have been marketed and developed in the manner described above using numerous components suffer from some form of problem.

Specifically, hydrophilic coating agents containing a water-soluble polymer as the main component have poor durability, and as the curing reaction of the coating film progresses, the hydrophilic active groups such as hydroxyl groups are gradually eliminated.

Inorganic coating agents such as silicones exhibit excellent durability and hydrophilicity, but the coating solution itself is often an organic solvent-based system, which can sometimes limit the working conditions. Even solventless systems suffer from small amounts of volatilization of volatile oligomers, meaning the working conditions are limited. Particularly in the case of coating agents having high curing reactivity, storage problems also arise due to the short lifespan of the solution.

In coating solutions containing an added photocatalyst, because the photocatalyst itself is a powder having extremely high cohesion, the coating solution must be formed as a coarsely dispersed sol (dispersed particle size: 100 nm to several μm) to which any of the various polymer vehicles has been added, and therefore the external appearance following coating may sometimes develop cloudiness, resulting in inferior transparency. Further, the hydrophilicity of the coating film can only manifest in environments where light is present. Moreover, decomposition and degradative dislodgement of the coating film caused by decomposition of the vehicle by photocatalytic reactions is also unavoidable.

In this manner, there is no coating solution currently available which is safe and easy to work with, and can form a film capable of exhibiting a satisfactory hydrophilic action over a long period of time.

Further, these coating agents often contain an added metal oxide such as silica containing a large number of hydroxyl groups in order to impart good hydrophilicity, but particles of these metal oxides have a high refractive index, and when coated onto a transparent substrate, and particularly a substrate having a low refractive index such as glass or polycarbonate, tend to display high reflectance relative to diagonally incident light striking the coated surface at an angle other than the normal direction, meaning the external appearance is often impaired.

Accordingly, there is considerable demand for a technique capable of simultaneously addressing the problems facing existing hydrophilic coating solutions, namely problems such as:

(1) difficulty in achieving high hydrophilicity,
(2) inability to maintain hydrophilicity for long periods,
(3) low transparency for the solution itself or the formed coating film, meaning application to substrates other than white substrates is difficult,
(4) limits on the pot life and/or the coating properties of the solution itself, and
(5) severe reflection from the coating film, thus impairing the external appearance, especially when viewed from an angle.

[Patent Document 1] JP 2006-116461 A
[Patent Document 2] JP 2006-272757 A

DISCLOSURE OF INVENTION

Problems to be Solved by the Invention

The present invention has been developed in light of the above problems, and has an object of providing a low-reflection, low-coherence inorganic hydrophilic coating solution which can effectively resolve the aforementioned problems (1) to (5), and yields a coating film which combines high hydrophilicity and high transparency, as well as providing a hydrophilic coating film obtained from the coating solution and a member using the coating film.

Means to Solve the Problems

As a result of intensive investigations aimed at achieving the above object, the inventors of the present invention were able to complete the present invention.

In other words, a first aspect of the present invention provides an inorganic hydrophilic coating solution comprising:

(a) an amorphous silicate compound-containing aqueous solution obtained by hydrolyzing and condensing a tetrafunctional silicon compound having a purity of 99.0 mass % or greater in an aqueous medium in the presence of a basic compound at a temperature within a range from normal temperature to 170° C., (b) water, and (c) in some cases, not more than 30 mass % of an alcohol, a ketone, a surfactant, or a mixture of 2 or more thereof, wherein the concentration of the solid fraction derived from the amorphous silicate compound-containing aqueous solution is 0.01 to 2.0 mass %, and the pH is 5 to 8.

For the component (c), examples of the alcohol include methanol, ethanol, n-propanol, isopropanol, n-butanol and isobutanol. Examples of the ketone include acetone, diacetone alcohol, methyl ethyl ketone, diisobutyl ketone, methyl isobutyl ketone and cyclohexanone. Examples of the surfactant include anionic surfactants such as soap (sodium fatty acid)-based surfactants, alkylbenzenesulfonate (ABS or LAS)-based surfactants, higher alcohol sulfate ester (AS)-based surfactants, polyoxyethylene alkyl ether sulfate (AES)-based surfactants, α-sulfo fatty acid ester (α-SF)-based surfactants, α-olefin sulfonate-based surfactants, monoalkyl phosphate ester (MAP)-based surfactants, and alkane sulfonate (SAS)-based surfactants; cationic surfactants such as alkyltrimethylarnmonium salt-based surfactants, dialkyldimethylammonium salt-based surfactants, alkyldimethylbenzylammonium salt-based surfactants, and amine salt-based surfactants; amphoteric surfactants such as alkylamino fatty acid salt-based surfactants, alkylbetaine-based surfactants, and alkylamine oxide-based surfactants; and nonionic surfactants such as polyoxyethylene alkyl ether (AE)-based surfactants, polyoxyethylene alkylphenol ether-based surfactants, alkyl glucoside-based surfactants, polyoxyethylene fatty acid ester-based surfactants, sucrose fatty acid ester-based surfactants, sorbitan fatty acid ester-based surfactants, polyoxyethylene sorbitan fatty acid ester-based surfactants, fatty acid alkanolamide-based surfactants, surfactants in which the hydrophobic groups of these nonionic surfactants have been modified with silicone or fluorine, acetylene alcohol-based surfactants, and acetylene glycol-based surfactants.

The amount of the component (c) is not more than 30 mass % of the hydrophilic coating solution of the present invention, namely 0 to 30 mass %, and is preferably 0 to 20 mass %, and more preferably 0 to 10 mass %.

The contact angle with water of a coating film formed from a dried and cured product of the inorganic hydrophilic coating solution is not more than 20°, and is preferably 15° or less.

In a preferred embodiment of the present invention, the basic compound in the component (a) is an organic ammonium salt, an alkylamine, an alkanolamine, a nitrogen-containing heterocyclic compound, or a combination of 2 or more thereof, and the amount added of the basic compound is 100 mol % or more relative to the tetrafunctional silicon compound.

In another preferred embodiment of the present invention, the tetrafunctional silicon compound is:

an amorphous silica having an $SiO_2$ content of 99 mass % or greater, and preferably 99.0 mass % or greater, a content of each of $Na_2O$, $K_2O$, $Fe_2O_3$, CaO, $SO_3$, MgO and $P_2O_5$ of 0.1 mass % or less, and a primary particle size of 500 nm or less, a tetrafunctional silicon alkoxide compound such as tetraethoxysilane (ethyl orthosilicate) having a purity of 99.0 mass % or greater, a tetrafunctional silicon halide compound such as silicon tetrachloride having a purity of 99.0 mass % or greater, or a combination of 2 or more thereof.

In a spectrum obtained by performing a $^{29}Si$-NMR measurement of the amorphous silicate compound-containing aqueous solution of component (a), when the surface area ratio of a peak attributable to a $Q_n$ structure (wherein n is an integer of 0 to 4) relative to all of the peaks is used to calculate a molar ratio $R_n$ (wherein n is as defined above) of silicon atoms within the $Q_n$ structure relative to all of the silicon atoms within the amorphous silicate compound-containing aqueous solution, then it is preferable that the following relationships are satisfied:

$$(R_0+R_1+R_2+R_3) \geq 90 \text{ mol \%}, R_3 \geq 40 \text{ mol \%, and}$$
$$R_4 \leq 5 \text{ mol \%}.$$

The inorganic hydrophilic coating solution of the present invention preferably further comprises, as a photocatalyst: (d) at least one type of microparticles, selected from the group consisting of metal oxide particles, metal chalcogenide particles and organometallic complex particles, having n-type semiconductor properties, and having a primary particle size of 1 to 100 nm. The microparticles are preferably at least one type of microparticles selected from the group consisting of titanium dioxide particles and tungsten trioxide particles, and having a primary particle size of 1 to 100 nm. At least one metal selected from the group consisting of vanadium, manganese, iron, cobalt, nickel, copper, zinc, niobium, molybdenum, ruthenium, rhodium, palladium, silver, tin, tungsten, platinum and gold, a compound (such as an oxide) of one of these metals, or a combination thereof is preferably supported on the aforementioned microparticles. In the present description, the expression "a primary particle size of 1 to 100 nm" means that when approximately 10 fields of view each 10 μm square are observed using a transmission electron microscope, the particle sizes of all visible particles are within a range from 1 to 100 nm.

A second aspect of the present invention provides a hydrophilic coating film formed from a dried and cured product of the above inorganic hydrophilic coating solution.

The hydrophilic coating film has a contact angle with water of not more than 20°, and preferably 15° or less, and the contact angle with water following storage in a dark place for one month is preferably maintained at not more than 20°, and more preferably 15° or less.

A third aspect of the present invention provides a member having a substrate, and the aforementioned hydrophilic coating film provided on a surface of the substrate.

The substrate is preferably a glass-based substrate, a polycarbonate-based substrate, an acrylic-based substrate, a polyester-based substrate or a fluorine-based substrate. It is preferable that when the surface on which the hydrophilic coating film is provided is observed at any angle from the normal direction relative to the surface through to the tangential direction of the surface, neither interference color nor cloudiness anomalies can be visually detected.

A fourth aspect of the present invention provides a cover panel for a solar cell module comprising the above member.

EFFECTS OF THE INVENTION

The low-reflection, low-coherence inorganic hydrophilic coating solution of the present invention can use an aqueous medium (namely, either water on its own, or a combination of water with at least one of an alcohol, a ketone and a surfactant), and therefore a coating solution that is safe and causes no substrate damage can be formed, and low-temperature curing at a temperature of about normal temperature to 100° C. is possible. The obtained coating film exhibits excellent levels of transparency and hardness, as well as excellent removability of adhered soiling, the surface maintains its hydrophilicity even after one month, and the hydrophilicity continues to manifest even in dark places. The formed coating film is composed entirely of inorganic substances and therefore exhibits good strength, and despite being an inorganic coating film, still exhibits superior transparency to incident light from all directions.

Moreover, the coating solution has a pH close to neutral and is water-based, and can therefore be used regardless of the work environment or method. Because the coating solution has these liquid properties and yet also has a liquid lifespan of half a year or longer, it offers excellent workability.

Accordingly, the present invention can provide a low-reflection, low-coherence inorganic hydrophilic coating solution which has excellent performance and handling properties, and provides excellent maintenance of aesthetic features.

BEST MODE OF CARRYING OUT THE INVENTION

The present invention is described below in more detail. In the present description, "normal temperature" refers to a temperature of 10 to 30° C.

The low-reflection, low-coherence inorganic hydrophilic coating solution according to the present invention contains a silicate having a specific composition and content ratio as the main component, and is obtained by properly adding a stain-resistant material such as a photocatalyst.

[Tetrafunctional Silicon Compound]

As the tetrafunctional silicon compound which functions as the silicate raw material, can be use any conventionally known material, provided that the purity is 99.0 mass % or greater. A single tetrafunctional silicon compound may be used alone, or a combination of 2 or more compounds may be used. Examples of the tetrafunctional silicon compound include silica, tetrafunctional silicon alkoxide compounds and tetrafunctional silicon halide compounds. In the present description, a "tetrafunctional silicon compound" refers to a compound which, upon hydrolysis and condensation, forms a silicate compound having a structure represented by the following formula:

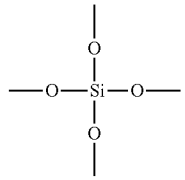

[Chemical Formula 1]

a tetrafunctional silicon alkoxide compound describes a silicon alkoxide compound which yields a structure represented by the above formula upon hydrolysis and condensation, and a tetrafunctional silicon halide compound describes a silicon halide compound which yields a structure represented by the above formula upon hydrolysis and condensation.

Silica

Examples of the types of silica which can be used include fumed silica, sol-gel method silica, solution-dispersed colloidal silica, and silica extracted from rice husks. A single silica may be used alone, or a combination of 2 or more varieties of silica may be used. Among the various possibilities, an amorphous silica having an $SiO_2$ content of 99.0 mass % or greater, a content of each of $Na_2O$, $K_2O$, $Fe_2O_3$, CaO (free calcium oxide), $SO_3$, MgO and $P_2O_5$ of 0.1 mass % or less, and a primary particle size of 500 nm or less is preferable.

If the amount of an alkali impurity containing Na, K, or Ca or the like (a compound containing an alkali metal or an alkaline earth metal), or a S- or P-based impurity exceeds 1 mass %, then the stability of the coating solution obtained following dilution and pH adjustment tends to deteriorate, and may be prone to gelling or the precipitation of solid contaminants. Further, particularly in the case where a titanium dioxide-based photocatalyst is added, if residual $Na^+$ ions exist, then these are gradually incorporated within the $TiO_2$, generating sodium titanate ($NaTiO_3$) that is inactive relative to light, thus inhibiting photocatalytic reactions. For this reason, Na-containing products are not desirable.

Further, if the amount of a metal impurity of Fe or Al or the like exceeds 0.1 mass %, then the solution may become colored, and the refractive index may increase. Moreover, the transparency of the film, and particularly the transparency relative to light that is diagonally incident on the surface of the formed coating film, may deteriorate.

In the present description, "a primary particle size of 500 nm or less" means that when approximately 10 fields of view each 10 μm square are observed using a transmission electron microscope, no particles exceeding 500 nm are observed.

Tetrafunctional Silicon Alkoxide Compound

Examples of the tetrafunctional silicon alkoxide compound include silicon alkoxide compounds represented by structural formula (1) shown below:

$$Si(OR^1)_x(OH)_{4-x} \quad (1)$$

wherein $R^1$ represents an organic group, and x represents an integer of 1 to 4, and condensation products thereof. A single tetrafunctional silicon alkoxide compound may be used alone, or a combination of 2 or more compounds may be used. Further, the tetrafunctional silicon alkoxide compound may be used in combination with a silica.

Multiple $R^1$ groups in the above formula may be the same or different. Specific examples of $R^1$ include alkyl groups such as a methyl group ($CH_3$), ethyl group ($CH_2CH_3$), propyl group ($CH_2CH_2CH_3$), isopropyl group ($CH_2(CH_3)$ $CH_3$) and butyl group ($CH_2CH_2CH_2CH_3$); and alkoxysilyl groups such as a triethyoxysilyl group ($Si(OCH_2CH_3)_3$). Among the various possibilities, tetramethoxysilane (in which x represents 4 and all the $R^1$ groups are methyl groups) and tetraethoxysilane (in which x represents 4 and all the $R^1$ groups are ethyl groups) can be used particularly favorably.

Tetrafunctional Silicon Halide Compound

An example of the tetrafunctional silicon halide compound is silicon tetrachloride.

[Basic Compound]

Examples of the basic compound used in the hydrolysis and condensation include organic bases such as organic ammonium salts, alkylamines, alkanolamines, nitrogen-containing heterocyclic compounds, and combinations of 2 or more of these bases. A single basic compound may be used alone, or a combination of 2 or more basic compounds may be used.

Organic Ammonium Salt

Examples of the organic ammonium salt include salts represented by structural formula (2) shown below:

$$R^2{}_4N^+X^-  \qquad (2)$$

wherein $R^2$ represents an organic group, and X represents a hydroxyl group (OH) or a halogen atom (F, Cl, Br or I).

A single organic ammonium salt may be used alone, or a combination of 2 or more organic ammonium salts may be used.

The $R^2$ groups in the above formula may be the same or different. Specific examples of $R^2$ include alkyl groups such as a methyl group ($CH_3$), ethyl group ($CH_2CH_3$), propyl group ($CH_2CH_2CH_3$), isopropyl group ($CH_2(CH_3)CH_3$) and butyl group ($CH_2CH_2CH_2CH_3$); and hydroxyalkyl groups such as a methylol group ($CH_2OH$) and an ethylol group ($CH_2CH_2OH$). Among the various possibilities, tetramethylammonium hydroxide and tetrabutylammonium hydroxide can be used particularly favorably.

Alkylamine

Examples of the alkylamine include nitrogen-containing compounds represented by structural formula (3) shown below:

$$R^3{}_y-NH_{3-y} \qquad (3)$$

wherein $R^3$ represents an alkyl group, and y represents an integer of 1 to 3, and salts thereof. A single alkylamine may be used alone, or a combination of 2 or more alkylamines may be used.

Multiple $R^3$ groups in the above formula may be the same or different. Specific examples of $R^3$ include alkyl groups such as a methyl group ($CH_3$), ethyl group ($CH_2CH_3$), propyl group ($CH_2CH_2CH_3$), isopropyl group ($CH_2(CH_3)CH_3$) and butyl group ($CH_2CH_2CH_2CH_3$).

Alkanolamine

Examples of the alkanolamine include nitrogen-containing compounds represented by structural formula (4) shown below:

$$R^4{}_y-NH_{3-y} \qquad (4)$$

wherein $R^4$ represents a hydroxyalkyl group, and y is the same as defined above, and salts thereof. A single alkanolamine may be used alone, or a combination of 2 or more alkylamines may be used.

Multiple $R^4$ groups in the above formula may be the same or different. Specific examples of $R^4$ include hydroxyalkyl groups such as a methylol group ($CH_2OH$) and an ethylol group ($CH_2CH_2OH$).

Aqueous Medium

The aqueous medium used in preparing the component (a) refers to a medium composed only of water, or composed of a mixture of water and another medium, for example at least one alcohol or ketone, wherein the total amount of media other than water within the mixture is not more than 30 mass %, and preferably 20 mass % or less.

[Conditions for Hydrolysis and Condensation]

The hydrolysis and condensation of the tetrafunctional silicon compound is performed in an aqueous medium, in the presence of a basic compound, at a temperature within a range from normal temperature to 170° C., using the aforementioned tetrafunctional silicon compound as a raw material in an amount that preferably represents 1 to 20 mass %, and more preferably 1 to 15 mass %, of the total mass of the reaction system (the raw material mixed liquid). The amount added of the basic compound is preferably at least 100 mol %, and more preferably 100 to 500 mol %, relative to the amount of the tetrafunctional silicon compound.

When the tetrafunctional silicon compound is a silica, a raw material mixed liquid is prepared in which the $SiO_2$ concentration is 1 to 15 mass %, the basic compound concentration is 2 to 25 mass % and the remainder is water, and this raw material mixed liquid is then preferably stirred under heating at 80 to 130° C. This yields a transparent hydrolyzed solution. When hydrolysis and condensation of the silica is performed under these conditions, the hydrolysis reaction proceeds readily, and therefore residual insoluble silica is unlikely, and because decomposition of the added basic compound is unlikely to occur, the precipitation of solid matter is also unlikely. Moreover, the basic compound used in the hydrolysis is preferably an organic ammonium salt, and of such salts, tetramethylammonium hydroxide or tetrabutylammonium hydroxide can be used particularly favorably.

If an inorganic base such as sodium hydroxide is used, then the polycondensation reaction of the obtained silicate tends to proceed rapidly, making it difficult to obtain a silicate of the desired composition, and the lifespan of the solution also shortens. Further, even if ions are removed in post-processing, residual cations tends to be retained in the film for long periods, causing deterioration in the film properties.

In a spectrum obtained by performing a $^{29}Si$-NMR measurement of the aqueous solution containing the amorphous silicate compound obtained by the hydrolysis and condensation, the chemical shift of each of the peaks is attributed as follows.

| | |
|---|---|
| $Q_0$: vicinity of −71.5 ppm | 0 condensate silicate monomer |
| $Q_1$: vicinity of −79 to −83 ppm | monocondensate |
| $Q_2$: vicinity of −87 to −91 ppm | dicondensate |
| $Q_3$: vicinity of −96 to −100 ppm | tricondensate |
| $Q_4$: vicinity of −107 to −112 ppm | tetracondensate |

As described above, it is preferable that the relationships $(R_0+R_1+R_2+R_3) \geq 90$ mol %, $R_3 \geq 40$ mol %, and $R_4 \leq 5$ mol % are satisfied. Provided that the relationship $R_4 \leq 5$ mol % is satisfied, the amount of the low-polarity $Q_4$ structure does not become too large, and therefore the adhesion of the cured film tends to improve. Further, provided that the relationship $R_3 \geq 40$ mol % is satisfied, the amount of the $Q_3$ structure is satisfactory, and therefore the condensation reactivity due to the $Q_0$ to $Q_2$ structures is prevented from becoming too high, thus making the stability of the inorganic hydrophilic coating solution more favorable.

The "inorganic hydrophilic coating solution" of the present invention describes a coating solution which, upon removal of the solvent by drying and curing, yields a substantially inorganic hydrophilic cured product. Here, the expression "substantially inorganic" means that the amount of inorganic matter relative to the total mass of the cured product is preferably at least 60 mass %, and more preferably 80 mass % or greater.

[Preparation and Application of Coating Solution]

The aqueous solution containing the amorphous silicate compound prepared by performing hydrolysis and condensation under the conditions described above is diluted so that the solid fraction concentration is within a range from 0.01 to 2.0 mass %, and the cations of the basic compound added to effect the hydrolysis and condensation are removed, for example by an ion exchange resin, to adjust the pH to a value of 5 to 8, thus obtaining the coating solution of the present invention. By adjusting the solid fraction concentration to 0.01 to 2.0 mass %, and preferably to a value within a range from 0.1 to 1.0 mass %, the stability of the obtained solution tends to be more favorable, and precipitation of solid matter is unlikely.

[Addition of Photocatalyst]

When a photocatalyst of the component (d) is also added to the inorganic hydrophilic coating solution of the present invention, the concentration of the added photocatalyst is preferably within a range from 0.01 to 10 mass %, and more preferably from 0.1 to 5 mass %. When the concentration of the photocatalyst satisfies this range, the stain-resistant activity provided by the photocatalyst tends to be more favorable, and the transparency is more readily maintained, meaning the external appearance tends to be more favorable.

Further, when the concentration (mass %) of the silicate compound within the inorganic hydrophilic coating solution is termed A, and the concentration (mass %) of the photocatalyst is termed B, then the ratio of A: (A+B) is preferably within a range from 0.05:99.5 to 99.5:0.05, and more preferably from 99.5:0.05 to 70:30. When the value of A:(A+B) satisfies this range, the stain-resistant activity due to the oxidative degradation derived from the photocatalyst manifests more readily, and the strength and transparency of the film tend to be favorable.

[Formation of Coating Film]

There are no particular limitations on the substrate to which the inorganic hydrophilic coating solution of the present invention is applied, provided that a coating film is able to be formed. Examples of the substrate material include inorganic materials and organic materials, wherein the inorganic materials include both non-metallic inorganic materials and metallic inorganic materials. These substrate materials may have all manner of shapes, depending on the purpose and the application.

Examples of the non-metallic inorganic materials include glass and ceramic materials. These materials can be in the form of commercialized products such as tiles, vitreous products, and mirrors.

Examples of the metallic inorganic materials include cast iron, steel, iron, iron alloys, aluminum, aluminum alloys, nickel, nickel alloys and zinc die casts, and these materials may be plated, or coated with an organic coating material. Further, a metal plating film may be formed on the surface of a non-metallic inorganic material or an organic material.

Examples of the organic material include synthetic resin materials such as vinyl chloride resin, polyethylene, polypropylene, polycarbonate, acrylic resin polyacetal, fluororesin, silicone resin, ethylene-vinyl acetate copolymer (EVA), acrylonitrile-butadiene rubber (NBR), polyethylene terephthalate (PET), polyethylene naphthalate (PEN), polyvinyl butyral (PVB), ethylene-vinyl alcohol copolymer (EVOH), polyimide, polyphenylene sulfide (PPS), polyetherimide (PEI), polyetheretherimide (PEED, polyetheretherketone (PEEK), melamine resin, and acrylonitrile-butadiene-styrene (ABS) resin; and natural, synthetic or semi-synthetic fibrous materials and fibrous products. These materials may be commercialized products of the desired shape and composition, including films, sheets, other molded items, and laminates.

Any conventional method can be used to apply the inorganic hydrophilic coating solution of the present invention to a substrate. Specifically, a method such as a dip coating method, spin coating method, spray coating method, roller method, brush application method, impregnation method, roll method, wire bar method, die coating method, gravure printing method or inkjet printing method can be used to form a coating film on the substrate.

The thickness of the formed coating film is preferably within a range from 1 to 500 nm, and a thickness within a range from 50 to 300 nm is particularly desirable. Provided that the thickness is within the range from 1 to 500 nm, the coating film is more likely to exhibit favorable strength and transparency, and be resistant to cracking.

Drying and curing of the coating film formed from the inorganic hydrophilic coating solution of the present invention may be performed by standing at normal temperature or by heating. When heating is conducted, the heat treatment is preferably performed within a temperature range from 50 to 200° C. for a period of 1 to 120 minutes, and is more preferably performed within a temperature range from 60 to 110° C. for a period of 5 to 60 minutes.

The water contact angle of the coating film formed by application of the inorganic hydrophilic coating solution of the present invention is typically not more than 20°, and is preferably 15° or less. Provided that the water contact angle is 20° or less, favorable stain resistance properties can be more readily achieved.

Further, the transparency of the coating film formed by application of the inorganic hydrophilic coating solution of the present invention is preferably of a level such that, relative to the transparency of the original substrate, the reduction in total light transmittance following formation of the coating film is not more than $\Delta 3\%$, and the increase in the haze is not more than $\Delta 2\%$. Provided that the reduction in total light transmittance due to the coating film is not more than $\Delta 3\%$, the transparency can be readily maintained, and the external appearance tends to be favorable. Further, provided that the increase in the haze is not more than $\Delta 2\%$, cloudiness is unlikely to occur in the film, and the external appearance tends to be favorable.

EXAMPLES

Specifics of the present invention are described below based on a series of examples and comparative examples. However, the present invention is in no way limited by these examples.

Example 1

For the tetrafunctional silicon compound, a high-purity fumed silica (not a commercially available product, an amorphous silica manufactured by Shin-Etsu Chemical Co., Ltd. having a primary particle size of not more than 500 nm) having the properties shown in the table below (units: mass %) was used.

TABLE 1

| SiO$_2$ | Fe$_2$O$_3$ | Total carbon | MgO | SO$_3$ | Na$_2$O | K$_2$O | CaO | P$_2$O$_5$ | Cl$^-$ |
|---|---|---|---|---|---|---|---|---|---|
| 99.04 | <0.01 | 0.01 | <0.01 | 0.03 | <0.01 | <0.01 | 0.10 | 0.008 | <0.01 |

The above fumed silica, water, and tetramethylammonium hydroxide (25 mass % aqueous solution, manufactured by Toyo Gosei Co., Ltd.) were mixed so that the ratio of silica : tetramethylammonium hydroxide=1:2 (molar ratio) and the silica content of the system at the start of the reaction was 5 mass %, and the mixture was then stirred under heating at 110° C. for 2 hours. The resulting solution was diluted with water to obtain a solid fraction concentration of 0.5 mass %, and was then adjusted to a pH of 7.0 using an ion exchange resin (product name: Dowex 50W-X8, manufactured by Dow Corning Corporation), thus obtaining a coating solution (solid fraction concentration: 0.5 mass %).

Example 2

Tetraethyl orthosilicate (purity: 99.9 mass % or higher, manufactured by Tama Chemicals Corporation, hereafter sometimes referred to as TEOS), water, tetramethylammonium hydroxide (25 mass % aqueous solution, manufactured by Toyo Gosei Co., Ltd.) and acetone (manufactured by Wako Pure Chemical Industries, Ltd., special grade) were mixed so that the ratio of tetramethylammonium hydroxide: tetraethyl orthosilicate=4:1 (molar ratio), and so that at the start of reaction, the tetraethyl orthosilicate content of the system was 15 mass % and the acetone content was 42 mass %, and the mixture was then stirred at normal temperature for 5 hours, yielding a white precipitate. The solvent was removed from the system, the precipitate was recovered, and following washing with acetone, the precipitate was redissolved in water, diluted with water to obtain a solid fraction concentration of 0.5 mass %, and then adjusted to a pH of 7.0 using an ion exchange resin (product name: Dowex 50W-X8, manufactured by Dow Corning Corporation), thus obtaining a coating solution (solid fraction concentration: 0.5 mass %).

Example 3

A photocatalyst Sagan Coat TO sol (product name: TO-85, a dispersion of Anatase-type titanium oxide, manufactured by Kon Corporation) was added to the coating solution of Example 1 in sufficient amount that the ratio of the solid fraction within the coating solution obtained in Example 1: TiO$_2$=90:10 (mass ratio), thus preparing a coating solution.

Example 4

A photocatalyst Sagan Coat TO sol (product name: TO-85, a dispersion of Anatase-type titanium oxide, manufactured by Kon Corporation) was added to the coating solution of Example 2 in sufficient amount that the ratio of the solid fraction within the coating solution obtained in Example 2: TiO$_2$=90:10, thus preparing a coating solution.

Comparative Example 1

With the exception of using a commercially available colloidal silica (purity: 20 mass %, product name: Snowtex OS, manufactured by Nissan Chemical Industries, Ltd.) instead of the high-purity fumed silica used in Example 1, a coating solution (solid fraction concentration: 0.5 mass %) was prepared in the same manner as Example 1.

Comparative Example 2

With the exception of using a commercially available silicate hydrolyzed solution (purity: 10 mass %, product name: HAS-10, manufactured by Colcoat Co., Ltd.) instead of the tetraethyl orthosilicate used in Example 2, a coating solution (solid fraction concentration: 0.5 mass %) was prepared in the same manner as Example 2.

Comparative Example 3

A commercially available peroxo titanic acid aqueous solution (product name: PTA-85, manufactured by Kon Corporation) was simply diluted with water to prepare a coating solution (solid fraction concentration: 0.5 mass %).

Comparative Example 4

A commercially available product (product name: TPX-85, manufactured by Kon Corporation) composed of a mixture of an aqueous solution of peroxo titanic acid and an Anatase-type titanium oxide was simply diluted with water to prepare a coating solution (solid fraction concentration: 0.5 mass %).

[$^{29}$Si-NMR Measurements]

The coating solutions prepared in Examples 1 and 2 and Comparative Examples 1 and 2 were each subjected to a $^{29}$Si-NMR measurement, and in each of the thus obtained spectra, the surface area ratio of each peak attributable to a Q$_n$ structure (wherein n is an integer of 0 to 4) relative to all of the peaks was used to calculate a molar ratio R$_n$ (wherein n is as defined above) of silicon atoms within the Q$_n$ structure relative to all of the silicon atoms within the coating solution. At this time, a previously prepared calibration curve illustrating the relationship between the above surface area ratio and R$_n$ was used.

[Application of Coating Solutions]

The coating solution was applied to a substrate formed from a PET (polyethylene terephthalate) film (thickness: 50 μm) that had been cut to A4 size and subjected to a corona discharge treatment, and the coating solution was then dried by heating to prepare a coating film having a thickness of approximately 200 nm. The conditions for the heated drying involved heating at 70° C. for 30 minutes.

[Normal Temperature Curing Time]

Following formation of the coating film, the film was left to stand at normal temperature, and a dry Kimwipe was used to scrub the film. The time at which this operation no longer resulted in the generation of visually detectable blemishes on the coating film was specified as the normal temperature curing time.

Coating films obtained by performing the normal temperature curing described above were used for the following tests.

[Film Thickness Measurement]

The film thickness was measured using a thin film measurement device F-20 (product name, manufactured by Filmetric, Inc.).

[Water Contact Angle]

The water contact angle for the coating film was measured at normal temperature using a contact angle meter CA-A (product name, manufactured by Kyowa Interface Science Co., Ltd.). Measurement of the water contact angle was also performed for a coating film that had been left in a dark place for one month. Moreover, the water contact angle was also measured for a coating film that had been exposed outdoors for one month.

[Water Film Formation after One Month Exposure]

A coating film that had been exposed outdoors for one month was brought into contact with water, and an evaluation was made, against the following criteria, as to whether or not a water film is formed on the surface of the coating film.

O: a water film was formed uniformly.

Δ: a water film was formed, but was not uniform.

x: the coating film repelled the water, and a water film was not formed.

[Total Light Transmittance, Haze]

These were measured using a digital haze meter NDH-20D (manufactured by Nippon Denshoku Industries Co., Ltd.). The measurement of diagonally incident light was preformed with the test sample inclined at an angle of 45°.

[Visually Detectable External Appearance Anomalies]

The surface on which the coating film was provided was observed at all angles from the normal direction relative to the surface through to a direction parallel to the surface, and visual confirmation was made as to whether interference color appeared, or whether cloudiness occurred due to reflection.

[Film Adhesion]

Testing was performed in accordance with the cross-cut tape peeling test of JIS K 5400 8.5, and the number of residual blocks was recorded. A higher number indicates superior adhesion.

[Film Strength]

Following preparation of each of the above coating films, each coating film was left to stand at normal temperature for at least 48 hours, and the coating film was then rubbed with a finger and scrubbed with a dry Kimwipe, and evaluated against the following criteria.

O: no blemishes were formed.

x: blemishes were formed.

[Stain Resistance]

The external appearance of a coating film that had been exposed outdoors for one month in the manner described above was inspected visually and evaluated against the following criteria.

O: no change in the external appearance from the initial state.

Δ: not stained, but the film itself developed color interference, whitening, or both.

x: water marks, rain spots, or both occurred.

[Optical Properties]

The optical properties of the coating film were evaluated against the following criteria.

O: no detectable whitening or interference color, and no reduction in transparency when tilted.

Δ: whitening, interference color, or both were detected, but no reduction in transparency occurred when tilted.

x: whitening, interference color, or both were detected, and a reduction in transparency occurred when tilted.

The results of the above tests are shown in Table 2.

TABLE 2

| | | Example 1 S method | Example 2 T method | Example 3 S method + TiO2 | Example 4 T method + TiO2 | Comparative Example 1 Snowtex OS | Comparative Example 2 HAS-10 | Comparative Example 3 PTA | Comparative Example 4 TPX-85 |
|---|---|---|---|---|---|---|---|---|---|
| Main component(s) | | silicate | silicate | silicate + photocatalyst | silicate + photocatalyst | silica | Silicate | peroxo titanic acid | peroxo titanic acid + photocatalyst |
| Compounds used | | silicate (raw material: silica) | silicate (raw material: TEOS) | silicate (raw material: silica) | silicate (raw material: TEOS) | silica | Silicate | peroxo titanic acid | peroxo titanic acid |
| Monomer condensation degree, molar ratio | ΣRn (n = 0→3)/mol % | 99 | | 99 | | 27 | 50 | — | — |
| | R3/mol % | 53 | | 43 | | 25 | 40 | — | — |
| | R4/mol % | <1 | | <1 | | 73 | 10 | — | — |
| Normal temperature curing time/hr | | 2 | 2 | 5 | 5 | 48< | 1 | 48< | 48< |
| Initial water contact angle/deg | | 5 | 6 | 5 | 7 | 12 | 56 | 24 | 22 |
| Water contact angle after 1 month in dark/deg | | 11 | 11 | 8 | 9 | 14 | 50 | 21 | 21 |
| Water contact angle after 1 month exposure/deg | | <5 | <5 | <5 | <5 | 6 | 45 | 19 | 15 |
| Water film formation after 1 month exposure | | 0 | 0 | 0 | 0 | 0 | x | Δ | 0 |
| Total light transmittance (change relative to substrate/Δ %) | perpendicular incident light | +4.2 | +4.0 | +3.1 | +3.2 | 3.1 | +3.7 | +0.6 | −3.7 |
| | 45° incident light | +4.2 | +4.0 | +2.9 | +3.2 | 3.7 | +1.2 | +0.4 | −5.1 |
| Reduction in transparency upon diagonally incident light | | none | None | none | none | none | slight reduction | none | slight reduction |
| Haze (change relative to substrate)/Δ % | perpendicular incident light | 0 | 0 | −0.1 | −0.1 | +0.2 | +0.8 | −0.1 | −0.1 |
| | 45° incident light | 0 | 0 | +0.1 | +0.1 | +0.3 | +1.2 | +0.6 | +1.0 |

TABLE 2-continued

|  | Example 1 S method | Example 2 T method | Example 3 S method + TiO2 | Example 4 T method + TiO2 | Comparative Example 1 Snowtex OS | Comparative Example 2 HAS-10 | Comparative Example 3 PTA | Comparative Example 4 TPX-85 |
|---|---|---|---|---|---|---|---|---|
| Cloudiness upon diagonally incident light | none | None | none | none | none | None | slight cloudiness | slight cloudiness |
| Visually detectable external appearance anomalies | none | None | none | none | none | strong interference color | interference color + slight cloudiness | interference color + slight cloudiness |
| Overall evaluations | | | | | | | | |
| Film adhesion | 100/100 | 100/100 | 100/100 | 100/100 | 5/100 | 5/100 | 90/100 | 90/100 |
| Film strength | ○ | ○ | ○ | ○ | x | ○ | x | x |
| Stain resistance | ○ | ○ | ○ | ○ | Δ | x | Δ | Δ |
| Optical properties | ○ | ○ | ○ | ○ | Δ | x | x | x |
|  | OK | OK | OK | OK | durability NG | stain resistance NG | external appearance NG | external appearance NG |

(Notes)
S method: silicate obtained by hydrolysis and condensation of silica.
T method: silicate obtained by hydrolysis and condensation of TEOS.

INDUSTRIAL APPLICABILITY

The hydrophilic coating solution of the present invention is an inorganic hydrophilic coating solution, yet can form a film that can suppress light reflection and coherence, and has a substrate stain resistance function derived from the extremely high hydrophilicity. Moreover, the coating solution is stable in aqueous systems and neutral environments, and can form a coating film even by curing at normal temperature, meaning handling of the solution is safe and easy, during both industrial inline production and onsite operations, and therefore a strong and transparent hydrophilic coating can be applied easily, primarily to residential construction materials such as glass and exterior walls.

The invention claimed is:

1. An inorganic hydrophilic coating solution comprising:
   (a) an aqueous solution comprising water and an amorphous silicate compound obtained by hydrolyzing and condensing a tetrafunctional silicon compound having a purity of 99.0 mass% or greater in an aqueous medium in the presence of an organic ammonium salt represented by structural formula (2) shown below:

$$R^2{}_4N^+X^- \quad (2)$$

wherein $R^2$ is independently at each instance selected from the group consisting of methyl, ethyl, propyl, isopropyl and butyl, and X represents a hydroxyl group (OH), and an amount added of the organic ammonium salt in the hydrolysis and condensation is 100 mol % to 500 mol % relative to the amount of the tetrafunctional silicon compound, at a temperature within a range from 10 to 170° C.,
   wherein the tetrafunctional silicon compound is:
   an amorphous silica having an $SiO_2$ content of 99.0 mass % or greater, a content of each of $Na_2O$, $K_2O$, $Fe_2O_3$, CaO, $SO_3$, MgO, and $P_2O_5$ of 0.1 mass% or less, and a primary particle size of 500 nm or less, or
   tetraethyl orthosilicate; and
   (b) optionally, not more than 30 mass % of an alcohol, a ketone, a surfactant, or a mixture of two or more thereof, wherein
   a concentration of a solid fraction derived from the aqueous solution comprising the amorphous silicate compound is 0.01 to 2.0 mass %, and a pH is 5 to 8, wherein in a spectrum obtained by performing a $^{29}$Si-NMR measurement of the aqueous solution comprising the amorphous silicate compound, when a surface area ratio of a peak attributable to a $Q_n$ structure, wherein n of $Q_n$ is an integer of 0 to 4, relative to all peaks is used to calculate a molar ratio $R_n$, wherein $Q_0$ is an uncondensed silicate monomer, $Q_1$ is a monocondensate of a silicate monomer, $Q_2$ is a dicondensate of a silicate monomer, $Q_3$ is a tricondensate of a silicate monomer, and $Q_4$ is a tetracondensate of a silicate monomer, and $R_n$, wherein n of $R_n$ is an integer of 0 to 4, is a molar ratio of silicon atoms within the $Q_n$ structure relative to all silicon atoms within the aqueous solution comprising the amorphous silicate compound, then the relationships shown below are satisfied:
   $(R_0+R_1+R_2+R_3) \geq 90$ mol %, $R_3 \geq 40$ mol %, and $R_4 \leq 5$ mol %.

2. The inorganic hydrophilic coating solution of claim 1, wherein a contact angle with water of a coating film obtained by drying and curing the inorganic hydrophilic coating solution is not more than 20°.

3. The inorganic hydrophilic coating solution of claim 1, further comprising: (d) microparticles selected from the group consisting of metal oxide particles, metal chalcogenide particles and organometallic complex particles, wherein the microparticles have n- type semiconductor properties and have a primary particle size of 1 to 100 nm.

4. The inorganic hydrophilic coating solution of claim 3, wherein the microparticles comprise microparticles selected from the group consisting of titanium dioxide particles and tungsten trioxide particles.

5. The inorganic hydrophilic coating solution of claim 3, wherein at least one metal selected from the group consisting of vanadium, manganese, iron, cobalt, nickel, copper, zinc, niobium, molybdenum, ruthenium, rhodium, palladium, silver, tin, tungsten, platinum, and gold, a compound of one of these metals, or a combination thereof is supported on the microparticles.

6. The inorganic hydrophilic coating solution of claim 1, wherein the organic ammonium salt is at least one organic ammonium salt selected from the group consisting of tetramethylammonium hydroxide, tetraethylammonium hydroxide, tetrapropylammonium hydroxide, tetrabutylammonium hydroxide, and ethyltrimethylammonium hydroxide.

7. The inorganic hydrophilic coating solution of claim 1, wherein the amount added of the organic ammonium salt is 200 mol % to 500 mol % relative to the amount of the tetrafunctional silicon compound.

8. The inorganic hydrophilic coating solution of claim 1, wherein the hydrolysis and condensation is performed at a temperature within a range from 80 to 130° C.

9. An inorganic hydrophilic coating film obtained by drying and curing the inorganic hydrophilic coating solution of claim 1.

10. A member comprising a substrate, and the hydrophilic coating film of claim 9 disposed on a surface of the substrate.

11. The member of claim 10, wherein the substrate comprises a glass, a polycarbonate, an acrylic, a polyester, or a fluorine based substrate.

12. A cover panel comprising the member of claim 10, wherein the cover panel is suitable for a solar cell module.

* * * * *